(12) United States Patent
Stenger et al.

(10) Patent No.: US 8,476,757 B2
(45) Date of Patent: Jul. 2, 2013

(54) FLIP CHIP INTERCONNECT METHOD AND DESIGN FOR GAAS MMIC APPLICATIONS

(75) Inventors: Peter A. Stenger, Woodbine, MD (US); Mark E. Schneider, Millersville, MD (US); Thomas A. Andersen, Catonsville, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 743 days.

(21) Appl. No.: 12/572,476

(22) Filed: Oct. 2, 2009

(65) Prior Publication Data

US 2011/0079925 A1    Apr. 7, 2011

(51) Int. Cl.
*H01L 23/34* (2006.01)
(52) U.S. Cl.
USPC .................................. 257/728; 257/E23.021
(58) Field of Classification Search
USPC .......................................... 257/728, E23.021
See application file for complete search history.

(56) References Cited

U.S. PATENT DOCUMENTS

| | | | |
|---|---|---|---|
| 5,028,454 A | | 7/1991 | Lytle et al. |
| 5,773,897 A | * | 6/1998 | Wen et al. ..................... 257/728 |
| 5,906,312 A | * | 5/1999 | Zakel et al. ................... 257/738 |
| 6,518,097 B1 | | 2/2003 | Yim et al. |
| 6,731,003 B2 | * | 5/2004 | Joshi et al. .................... 257/738 |
| 6,838,748 B2 | * | 1/2005 | Ishio et al. .................... 257/728 |
| 7,012,337 B2 | * | 3/2006 | Nogome et al. ............... 257/728 |
| 7,429,796 B2 | * | 9/2008 | Abe et al. ...................... 257/778 |
| 7,629,687 B2 | * | 12/2009 | Kozaka et al. ................ 257/737 |
| 8,008,753 B1 | * | 8/2011 | Bolognia ....................... 257/728 |
| 2003/0080420 A1 | | 5/2003 | Ohara |
| 2003/0127747 A1 | * | 7/2003 | Kajiwara et al. .............. 257/778 |
| 2004/0152232 A1 | | 8/2004 | Arnold et al. |
| 2004/0183194 A1 | | 9/2004 | Liu et al. |
| 2005/0023663 A1 | * | 2/2005 | Chen et al. .................... 257/678 |
| 2005/0110163 A1 | | 5/2005 | Koo et al. |
| 2005/0151268 A1 | | 7/2005 | Boyd et al. |
| 2005/0161756 A1 | | 7/2005 | Sun et al. |

* cited by examiner

*Primary Examiner* — Matthew Landau
*Assistant Examiner* — Sun M Kim
(74) *Attorney, Agent, or Firm* — Rothwell, Figg, Ernst & Manbeck, P.C.

(57) ABSTRACT

A monolithic microwave integrated circuit (MMIC) flip chip interconnect is formed by coating an active side of the chip with a dielectric coating, such as benzocyclobutene (BCB), that inhibits deposition of metal plating materials. A portion of the dielectric coating is removed to expose bond pads on the active side of the chip, stud bumps are bonded to the bond pads, and the active side is then plated with first and second consecutive metal plating materials, such as nickel and gold, respectively, that do not adhere to the dielectric coating. The chip is then oriented such that the plated stud bumps on the active side of the chip face bond pads on a substrate, and the stud bumps on the chip are bonded to the bond pads on the substrate.

10 Claims, 5 Drawing Sheets

FLIP CHIP INTERCONNECT METHOD AND DESIGN FOR GAAS MMIC APPLICATIONS

BACKGROUND OF THE INVENTION

1. Field of the Invention

The invention relates generally to microelectronic interconnects and, in particular, to flip chip methods of interconnecting microelectronic components, and assemblies resulting therefrom.

2. Background of the Related Art

Electronic devices commonly include one or more semiconductor integrated circuit (IC) chips mounted on a circuit board. These semiconductor IC chips, sometimes referred to as "microchips," are mounted such that electrical connections are made between the chips and the circuit board. Several techniques have been developed over the years to mount chips on a circuit board, including so-called wire bonding and flip chip techniques.

In the case of wire bonding, the chips are connected to the circuit board via mechanical carriers. The chips are configured to be mounted on the mechanical carriers and interconnected using wire bonds. More specifically, the chips are formed with metal pads or contacts on the active surface and are placed in the carriers with the pads facing outwardly so that metal wires can be bonded to these pads. The mechanical carriers are in turn connected to the circuit board by a plurality of pins leading from the wire bonds. This technique, while effective for some purposes, has several drawbacks. For one thing, the presence of the mechanical carrier increases the size of the device, making the wire bonding technique unsuitable for applications requiring the smallest possible footprint. Further, the length of the wires needed to connect the chips to the carrier can create levels of inductive reactance and radiation that are too high for certain applications.

The flip chip mounting technique was developed in the 1960's to form connections between silicon IC chips and circuit boards without the use of wire bonds. The technique involves forming a series of solder bumps on the active side of the chip to form metallurgical interconnections with metal bond sites on the board. More specifically, the active side of the integrated circuit is flipped upside down to facilitate contact between the bumps on the chip and the metal bond sites on the board. A soldering flux is typically used to remove metal oxides and promote wetting of the solder when the assembly is heated above the temperature of the solder. This process is referred to as reflow soldering.

FIGS. 1a-1c illustrate some common flip chip designs. In each case, it will be observed that the flip chip technique allows for an extremely compact package. Further, because the length of the interconnect is shorter in the flip chip design, there is a lower level of inductive reactance which leads to wider bandwidth performance and a lessening of the tuning required.

FIG. 1a shows an example of a solder bump connection flip chip interconnect. In this flip chip design, a silicon microchip 201 layered with a dielectric material 203 and fitted with a piece of under bump metal which acts as a conductive bond pad 205. Further, the substrate 211 to which the silicon microchip 201 is attached is also fitted with a bond pad 209. Between the bond pads 205 and 209 is placed a solder ball 207 which acts as the conductive interconnect between the silicon microchip 201 and the substrate 211.

FIG. 1b shows a soldered metal stud connection flip chip interconnect. In this flip chip design a silicon microchip 301 is again layered with a dielectric material 303 and fitted with a piece of under bump metal which acts as a conductive bond pad 305. Again the substrate 313 is also fitted with a bond pad 311. A portion of conductive solder or epoxy 309 is placed on the substrate bond pad 311. A metal ball 307 completes the connection between the silicon microchip 301 and the substrate 313.

FIG. 1c shows a thermal compression or ultrasonic bonded gold stud bump connection flip chip interconnect. In this flip chip design, a silicon microchip 401 has a bond pad 403, and a substrate 409 also has a corresponding bond pad 407. The connection between the corresponding bond pads is achieved by placing a gold ball 405 between the bond pads 403, 407 and applying either heat and pressure or ultrasonic energy in the appropriate degree.

While these flip chip interconnect designs have proven effective for use with silicon microchips, they have not been effective for use with GaAs integrated circuits that process high frequency radio frequency ("RF") and millimeter wave ("MMW") signals. The specific deficiencies are as follows.

First, GaAs wafers do not have the mechanical strength necessary to survive conventional flip chip techniques. The silicon wafers used in prior art flip chip designs have generally been 15 mils in thickness, this level of thickness provided the silicon flip chips with a high level of mechanical strength necessary to withstand the prior art implementations of flip chip interconnects. However, a typical GaAs microchip is a mere 4 mils thick, and is therefore prone to cracking during flip chip assembly. This is especially true when the assembly is done by way of thermal compression which uses extreme force to bond the flip chip to the substrate with many stud bumps. Stud bumps are pieces of metal or solder which act as connectors between the bond pads of the flip chip and the bond pads of the substrate. In addition to the weakness caused by the lack of thickness, GaAs has a lower intrinsic fracture strength than silicon, meaning that even if a GaAs and silicon microchip were the same thickness the GaAs microchip would be weaker due to inherent physical properties. While thicker GaAs circuit designs have been proposed in order to compensate for the above discussed weakness, they are not acceptable for thermal dissipation in many applications due to the much lower thermal conductivity of GaAs as compared to Silicon. Further, thicker GaAs microchips have been prone to unwanted signal moding in MMW microchip designs. Thicker GaAs (e.g. 25 mils) and the associated high dielectric constant (12.9) result in lower cutoff frequencies of the various order RF modes defined by the structure. Energy can be lost and distorted by these modes at the desired operating frequencies if the cutoff frequency for the higher order mode is less than the operating frequency.

Further, the poor thermal conductivity of GaAs in relation to silicon presents certain difficulties. The silicon wafers used in prior art flip chip designs have higher thermal conductivity properties than does GaAs. Because GaAs microchips have poor thermal conductivity properties they are typically soldered to heat spreaders with high temperature gold/tin solder in an effort to minimize device junction temperature. During this high temperature process, the solder bump balls, generally applied at the wafer level before singulation, used to connect the GaAs microchip to the substrate become molten and any scrubbing motion or weight that is generally required to achieve void free solder could easily impair these molten solder bump balls. Thus, the thermal conductivity properties of GaAs make its use in prior art flip chip interconnect designs difficult. Additionally soldering hard gold stud bump interconnects that might be envisioned to solve this problem instead form an intermetallic alloy with lead tin solder resulting in a very weak solder joint. Other solder choices have chronic problems as well involving joints that are extremely brittle and weak, have too low of a melting temperature, or are environmentally sensitive as with Indium based solders.

Accurate probe performance testing of low frequency silicon requires an individual ground-signal-ground probe needle make contact. However, accurate RF probing of GaAs substrates requires precision three point coplanar impedance controlled contacts. Therefore, non-uniform bump height can result in one or more of the ground-signal-ground probe needles not making contact, thereby impairing the measurement results. Bump spacing will also vary the impedance of the ground-signal-ground interface, thus impairing the measurement results further.

Substrates generally used to integrate flip chip silicon microchips are too lossy for RF applications. Examples of these lossy materials are FR-4, Polyimide, high temperature co-fired ceramic ("HTCC"), and 351 low temperature co-fired ceramic ("LTCC"). Fortunately, emerging materials, such as 943 LTCC and Ferro LTCC, that have significantly lower RF loss, especially at MMW frequencies are being developed for high density routing. These materials require use of metal systems that allow flip chip assembly.

New designs and methods are needed to mitigate these deficiencies so that flip chip integration of RF and MMW GaAs microchips can be utilized.

SUMMARY OF THE INVENTION

Accordingly, it is an object of the present invention to provide a flip chip interconnect method and assembly that is suitable for high frequency applications. The invention addresses the multitude of issues (thermal, strength, RF moding, intermetallic weak solder joints, non uniform bump height) that exists by way of applying current flip chip methods based on Silicon substrates to GaAs chips propagating RF and MMW signals.

In accordance with a first aspect of the present invention, a method of flip chip packaging a monolithic microwave integrated circuit (MMIC) chip having an active side with surface bond pads includes the steps of coating the active side of the chip with a dielectric coating that inhibits deposition of metal plating materials; removing a portion of the dielectric coating to expose the bond pads; bonding stud bumps to the bond pads; plating the active side of the chip with a first metal plating material that does not adhere to the dielectric coating such that the stud bumps are plated with the first metal plating material while other portions of the chip are not plated with the first metal plating material; plating the active side of the chip with a second metal plating material that does not adhere to the dielectric coating such that the plated stud bumps are further plated with the second metal plating material while other portions of the chip are not plated with the second metal plating material; orienting the chip so that the stud bumps on the active side of the chip face bond pads on a substrate; and bonding the stud bumps on the chip to the bond pads on the substrate. In an embodiment, the first plating material is nickel, the second plating material is gold, the MMIC chip is formed from a GaAs wafer, and the substrate is a low temperature cofired ceramic substrate. In an embodiment, the dielectric coating is benzocyclobutene (BCB). The method may also include one or more of the steps of mounting the chip on a tab having a coefficient of thermal expansion comparable to the chip, plating exposed edges of said chip with the first and second plating materials, and plating the peripheral portion of the active side of the chip with the first and second plating materials.

In accordance with another aspect of the present invention, a monolithic microwave integrated circuit (MMIC) flip chip interconnect includes a MMIC chip having an active side, a plurality of surface bond pads on a first portion of said active side, and a dielectric coating on a second portion of said active side; a substrate spaced from said active side of said MMIC chip and having surface bond pads facing said surface bond pads on said MMIC chip; a plurality of stud bumps bonded to said surface bond pads on said MMIC chip; a first layer of a first plating material plating said stud bumps; a second layer of a second plating material plating said first layer; and a solder bond connecting said plated stud bumps to said surface bond pads on said substrate. In an embodiment of the flip chip interconnect, the first plating material is nickel and the second plating material is gold. Furthermore, the MMIC chip can be formed from a GaAs wafer and the substrate can be a low temperature cofired ceramic substrate. The dielectric coating is preferably benzocyclobutene (BCB). In an embodiment of the flip chip interconnect, a tab is mounted on an active side of the MMIC chip and has a coefficient of thermal expansion comparable to said chip. Exposed edges of the chip can be covered with the first and second plating materials. In addition, an exposed peripheral portion of the active side of said chip adjacent dicing streets can be covered with the first and second plating materials.

The present invention will become more fully understood from the forthcoming detailed description of the preferred embodiments when read in conjunction with the accompanying drawings, in which like reference numerals are used to denote like features.

DETAILED DESCRIPTION OF THE PREFERRED EMBODIMENTS

Figure 3:
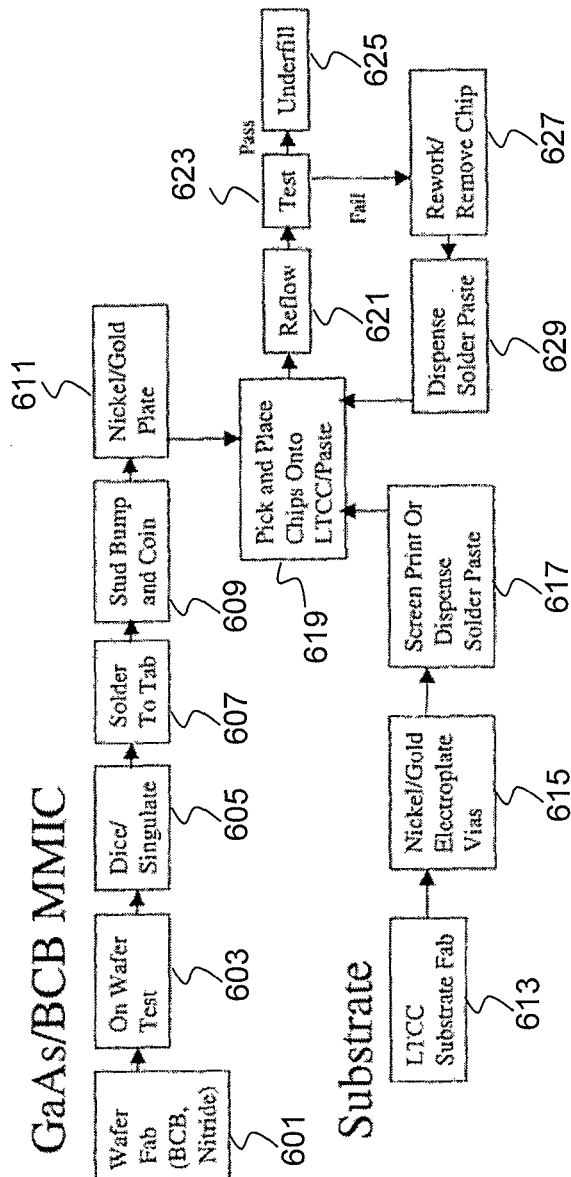
FIG. 3 is a flow chart illustrating a method of creating MMIC flip chip interconnect according to an embodiment of the present invention.

FIG. 3 is a flow chart illustrating a method of making a flip chip interconnect according to one embodiment of the present invention. The method is particularly advantageous for RF applications requiring thin (e.g., no more than about 4 mil thick) high-heat flux GaAs monolithic microwave integrated circuit (MMIC) chips to be mounted on low temperature co-fired ceramic (LTCC) substrates although it can be applied to other types of chips and substrates. At step 601 a layer of Silicon Nitride ($Si_3N_4$) is deposited on a GaAs wafer with one or more MMICs thereon using chemical vapor deposition (CVD) or plasma-enhanced chemical vapor deposition (PECVD), or other suitable process. In a preferred embodiment, the thickness of the $Si_3N_4$ layer is about 1600 Å±50 to provide device passivation. Next, a layer of a dielectric material, such as benzocyclobutene (BCB), that inhibits deposition of metal plating materials, is applied over the $Si_3N_4$ layer, preferably by spin-coating, and cured. The thickness of the dielectric layer is preferably sufficient such that RF performance of the device is substantially unaffected by proximity to the substrate.

At step 601 a standard photoresist process is used to selectively etch the Si₃N₄/BCB layers to expose portions of the GaAs wafer. The wafer is then thinned to the final thickness (e.g., 4 mils) and the lapped side is gold plated.

At step 603, standard on-wafer tests are conducted in order to determine the functionality of the MMIC prior to further processing.

At step 605 the wafer is diced along "dicing lanes" or "streets" to singulate individual 4 mil thick MMIC chips. This dicing/singulation step can be performed in any number of ways well known to those of skill in the art.

At step 607 at least one of the coated thin chips is gold/tin soldered to a much stronger tab. Preferably, the chip is gold/tin soldered to a nickel/gold plated copper molybdenum metal tab that has the same coefficient of thermal expansion as the GaAs chip. The tab spreads heat from the chip's active devices to minimize junction temperatures, and helps the chip survive mechanical stresses during assembly thereby minimizing the risk of fracturing the fragile chip.

In a presently preferred embodiment, the tab is composed of 15% Cu and 85% Mb, and is about 4 to about 10 mm thick. In order to ensure that the tab remains soldered to the fragile chip throughout the assembly process, gold/tin solder is used. Gold/tin solder has a melting point of about 280° C./536° F., and because this temperature is never reached during any subsequent steps of the assembly process, there is little chance that the tab will come undone from the GaAs chip.

At step 609 the tabbed chip is stud-bumped with gold balls formed from gold wire. The balls are bonded with thermal compression or thermal sonic energy in the same way a ball bond is formed on the ball end of a conventional wire bond. The wire emanating from the top of the ball after bonding is then broken off at the ball. This is repeated at all the pads requiring stud bumps. The bumps are then all coined as a group to achieve uniform height, maximizing interconnect yield during the flip chip attachment to the integrating substrate.

At step 611 the chip assembly is electroless plated with Nickel (Ni) and then Gold (Au). The nickel barrier plating is used on the gold stud bump balls such that lead tin solder can be used, mitigating the unreliable tin gold inter-metallic that would occur when soldering directly to the gold ball. The immersion gold thickness is kept minimal to prevent the nickel from oxidizing so that it will solder. Further, this layer is kept thin to prevent the formation of any significant tin gold inter-metallic. Preferably, the stud bumps, stud bump bonding pads, gold plated bump pad feed lines from under the Nitride/BCB, and the exposed GaAs, all four edges and top side edge street, receive 240-360 μI of electroless nickel and 2.7-3.3 μI of immersion gold.

Meanwhile, at step 613, an LTCC substrate is fabricated. In a preferred embodiment, the LTCC substrate is fabricated such that the signal can be routed laterally as required at the top of the first layer of the LTCC substrate, however, a via separate from the conductive layer is located at the bump interface with the chip. This design is advantageous because lead tin solder is flowed onto the interconnect pads on the substrate that will connect with the bumps on the chip. Solder run out is prevented on the microchip side by the BCB boundary around the bump. On the substrate side, the via without a printed conductive layer eliminates solder run out since the solder will not flow onto the LTCC substrate.

At step 615 the cofired via is plated with Ni and then Au. Preferably, the via is electroplated with approximately 300 μl of nickel followed by immersion gold. The cofired via gold paste is more difficult to catalyze with electroless techniques. Therefore, the vias are electroplated because a catalyst is not required.

At step 617 the assembly process screen prints lead/tin solder paste on to all the vias that will receive a mating chip bump interconnect.

At step 619 the bumped and plated microchips are picked and placed to automatically align the chip bumps with the corresponding substrate pads or vias.

At step 621 the bumps are pressed into the paste and sent through a reflow oven where the bump will be soldered to the LTCC via and then cleaned.

At step 623 the microchip is tested.

At step 625, an underfill material is flowed in and around the space between the chip, substrate, and bumps. The underfill material is preferably a low viscosity material that is thermally matched to the substrate. The underfill prevents moisture from condensing between the microchip and substrate and minimizes the stress on the bumps over time and temperature. This is the final step in the assembly process.

If the microchip did not function properly in step 621, the chip is reworked/removed from the substrate at step 627.

At step 629 solder paste is again dispensed and steps 619 through 629 are repeated until the microchip passes the test at step 623.

Figure 1A:
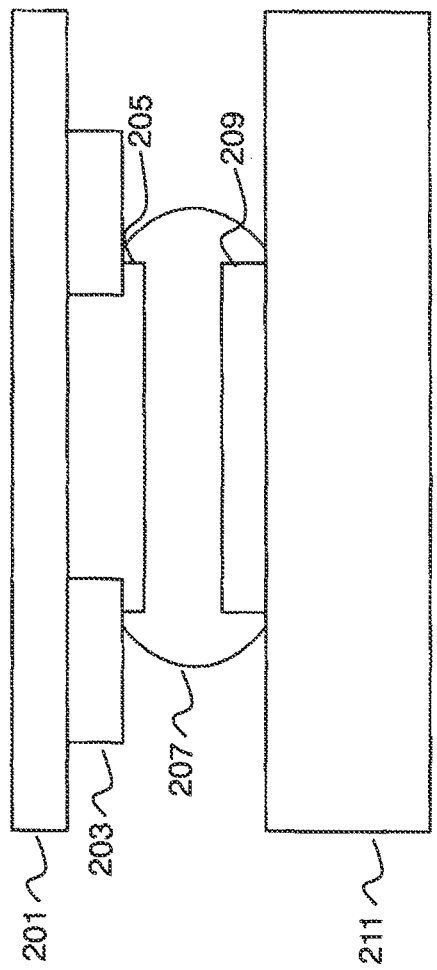
FIG. 1a is a schematic diagram of a solder bump connection flip chip design.
Figure 1B:
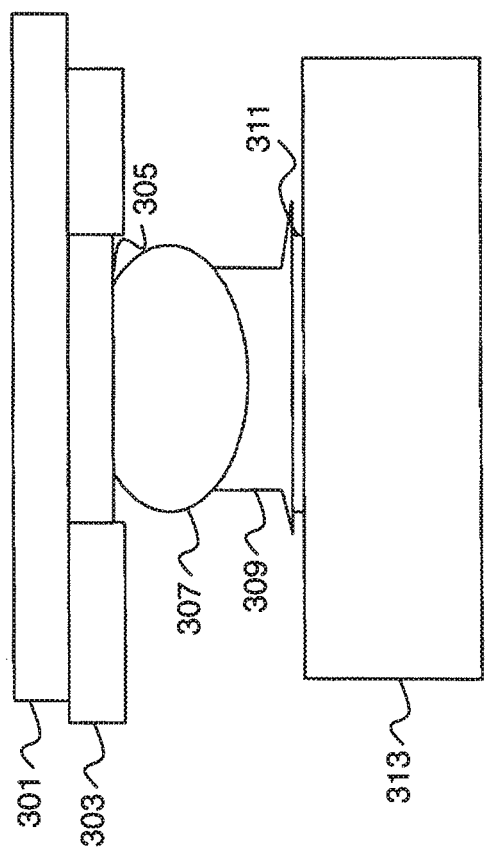
FIG. 1b is a schematic diagram of a soldered metal stud connection flip chip design.
Figure 1C:
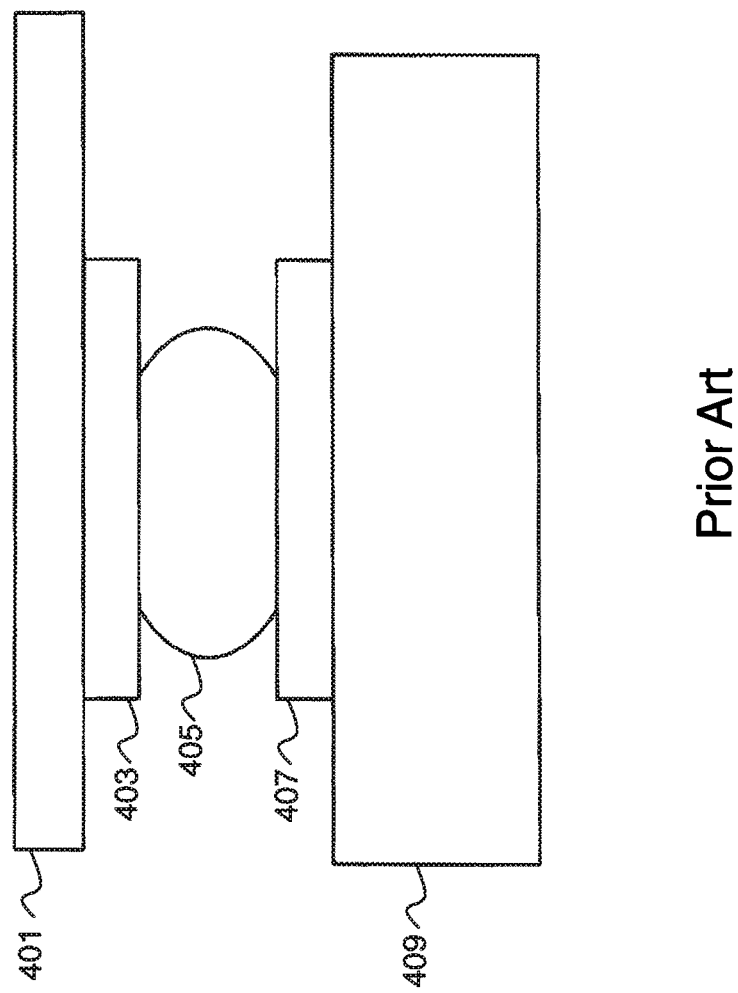
FIG. 1c is a schematic diagram of a thermal compression or ultrasonic bonded gold stud bump connection flip chip design.
Figure 2:
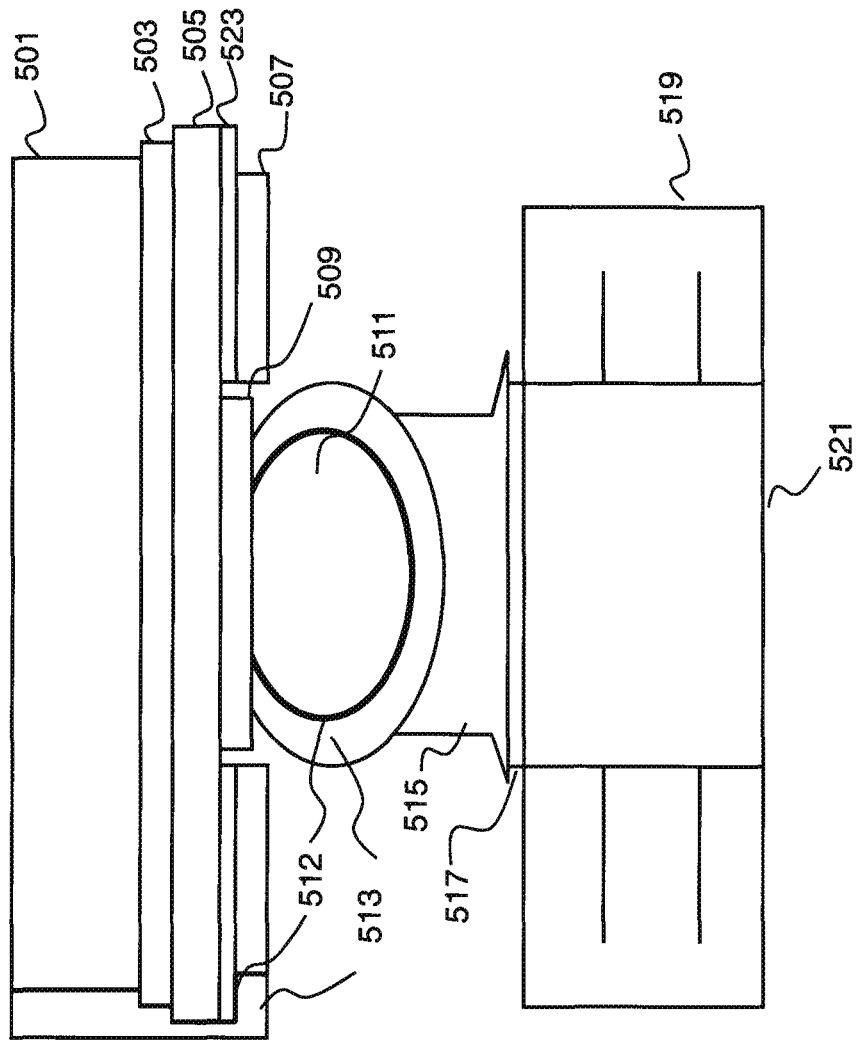
FIG. 2 is a schematic diagram of a MMIC flip chip interconnect according to an embodiment of the present invention.

FIG. 2 illustrates an embodiment of a flip chip interconnect produced according to the method of the present invention. Chip 505 is preferably made of thin (4 mil thick) GaAs and is connected to substrate 519 using a flip chip interconnect. Substrate 519 is preferably an LTCC. The chip 505 is layered with a Nitride layer 523 and a BCB layer 507 which have been etched to reveal the chip in the area were the bond pad 509 is placed. The chip 505 is soldered using a layer of solder 503, for example gold/tin solder, to a tab 501 which matches the coefficient of thermal expansion of the chip and spreads the heat. For example, in the case of a GaAs chip, the tab can be made of copper molybdenum. A stud bump 511 made of a conductive substance, for example gold, is placed on the bond pad 509. The entire chip is then electrolessly plated with nickel 512 and then immersion plated with gold 513. This continuous conductive plating adheres to all four edges and the narrow circuit side strip in the BCB opening that feeds the metal pad supporting the gold stud bump but not the BCB. The edge plating provides enhanced RF isolation to neighboring chips during integration. This is a benefit of this invention over the prior art where the edges are not plated with metal. The plating does not adhere to the BCB coating that covers the entire chip thereby not affecting the prior RF performance. The BCB is etched open only in areas where access to the stub bump pads and scribe streets are needed.

The substrate 519 has a via 521 filled with a conductive substance that is compatible with the substrate 519. The via 521 is topped with an electroplated Ni/Au bonding pad 517 for connecting the substrate 519 to the chip 505. An amount of solder 515, for example lead/tin solder, is placed on the bond pad 517 and the now plated stud bump 511, 513 is connected to the solder 515. Then following the reflow and underfill process the flip chip of FIG. 2 is complete.

From the above, it will be appreciated that one aspect of the current invention consists of a selective plating process applied to compression bonded or ultrasonically bonded gold stud bumps that are bonded to gold plated GaAs microchip interconnect pads. The interconnect pads are accessed through openings in a BCB coating layer that coats the entire microchip. The BCB coating protects the active and passive circuits on the microchip from environmental stress and also acts as an intrinsic RF buffer layer providing immunity to RF proximity affects caused by subsequent flip chip underfill and/or mounting substrate.

In one embodiment of the current invention, electroless nickel and immersion gold are deposited to the stud bump and plated pad so that it can be lead tin soldered without consuming gold metal and forming unreliable intermetallics. The nickel/gold plating also increases the strength of the bump to microchip interconnect. The BCB insulator and the nitride insulator layers are not catalyzed by the electroless nickel solution and therefore do not take plating. For singulated chip cases, the edge of the GaAs is also catalyzed and becomes deposited with the nickel electroless plating and gold immersion plating which enhances microchip to microchip RF isolation in closely spaced microchip arrangements such as antenna arrays. The microchip is flip mounted to an LTCC substrate and the plated studs are lead tin soldered to nickel/gold electroplated cofired vias in an LTCC substrate. Post fire metal applied on top of the via can be plated in the same way.

Although the invention has been described with reference to a preferred embodiment, it will be apparent to those of skill in the art that certain modifications, variations, and alternative constructions can be made to the described embodiment within the spirit and scope of the invention as claimed.

The invention claimed is:

1. A monolithic microwave integrated circuit (MMIC) flip chip interconnect comprising:
   a MMIC chip having an active side, a plurality of surface bond pads on a first portion of said active side, and a dielectric coating on a second portion of said active side;
   a substrate spaced from said active side of said MMIC chip and having surface bond pads facing said surface bond pads on said MMIC chip;
   a plurality of stud bumps bonded to said surface bond pads on said MMIC chip;
   a first layer of a first plating material plating said stud bumps;
   a second layer of a second plating material plating said first layer;
   a solder bond connecting said plated stud bumps to said surface bond pads on said substrate; and
   a tab mounted on said MMIC chip, wherein said tab is covered on at least one side with said first and second plating materials.

2. The flip chip interconnect of claim 1, wherein said first plating material is nickel.

3. The flip chip interconnect of claim 2, wherein said second plating material is gold.

4. The flip chip interconnect of claim 3, wherein said MMIC chip is formed from a GaAs wafer.

5. The flip chip interconnect of claim 4, wherein said substrate is a low temperature cofired ceramic substrate.

6. The flip chip interconnect of claim 5, wherein said dielectric coating is benzocyclobutene (BCB).

7. The flip chip interconnect of claim 1, wherein said tab has a coefficient of thermal expansion comparable to said chip.

8. The flip chip interconnect of claim 7, wherein said tab is mounted on a side of said chip opposite the active side of said chip.

9. A monolithic microwave integrated circuit (MMIC) flip chip interconnect comprising:
   a MMIC chip having an active side, a plurality of surface bond pads on a first portion of said active side, and a dielectric coating on a second portion of said active side;
   a substrate spaced from said active side of said MMIC chip and having surface bond pads facing said surface bond ads on said MMIC chip;
   a plurality of stud bumps bonded to said surface bond pads on said MMIC chip;
   a first layer of a first plating material plating said stud bumps;
   a second layer of a second plating material plating said first layer; and
   a solder bond connecting said plated stud bumps to said surface bond pads on said substrate, wherein exposed edges of said chip are covered with said first and second plating materials.

10. A monolithic microwave integrated circuit (MMIC) flip chip interconnect comprising:
    a MMIC chip having an active side, a plurality of surface bond pads on a first portion of said active side, and a dielectric coating on a second portion of said active side;
    a substrate spaced from said active side of said MMIC chip and having surface bond pads facing said surface bond pads on said MMIC chip;
    a plurality of stud bumps bonded to said surface bond pads on said MMIC chip;
    a first layer of a first plating material plating said stud bumps;
    a second layer of a second plating material plating said first layer; and
    a solder bond connecting said plated stud bumps to said surface bond pads on said substrate, wherein an exposed peripheral portion of the active side of said chip adjacent dicing streets is covered with said first and second plating materials.

* * * * *